(12) United States Patent
Gambino et al.

(10) Patent No.: US 7,207,096 B2
(45) Date of Patent: Apr. 24, 2007

(54) METHOD OF MANUFACTURING HIGH PERFORMANCE COPPER INDUCTORS WITH BOND PADS

(75) Inventors: Jeffrey P. Gambino, Westford, VT (US); William T. Motsiff, Essex Junction, VT (US); Erick G. Walton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 10/707,896

(22) Filed: Jan. 22, 2004

(65) Prior Publication Data

US 2005/0160575 A1 Jul. 28, 2005

(51) Int. Cl.
*H01F 7/127* (2006.01)
*H01L 21/44* (2006.01)

(52) U.S. Cl. .................. 29/602.1; 438/612; 438/613; 438/652; 336/200

(58) Field of Classification Search ............. 29/602.1, 29/606, 604; 438/612, 613, 652, 460; 257/529, 257/750, E21.508, E23.021; 336/199, 200, 336/219
See application file for complete search history.

(56) References Cited

U.S. PATENT DOCUMENTS 5,300,461 A * 4/1994 Ting ........................ 438/460

| | | | |
|---|---|---|---|
| 5,478,773 A | 12/1995 | Dow et al. | |
| 5,695,810 A | 12/1997 | Dubin et al. | |
| 6,153,935 A | 11/2000 | Edelstein et al. | |
| 6,259,160 B1 | 7/2001 | Lopatin et al. | |
| 6,730,982 B2 * | 5/2004 | Barth et al. ............... | 257/529 |
| 2002/0197844 A1 | 12/2002 | Johnson et al. | |

FOREIGN PATENT DOCUMENTS

| JP | 5-347212 | * 12/1993 | ............. 29/602.1 |
|---|---|---|---|
| JP | 2002-118111 A | 4/2002 | |

* cited by examiner

*Primary Examiner*—A. Dexter Tugbang
(74) *Attorney, Agent, or Firm*—Scully, Scott, Murphy & Presser, P.C.; William D. Sabo, Esq.

(57) ABSTRACT

A method for manufacturing high performance copper inductors includes providing a tall, Cu laminate spiral inductor is formed at the last metal level, and at the last metal +1 level, with the metal levels being interconnected by a bar via having the same spiral shape as the spiral metal inductors at the last metal level and the last metal +1 level. The method includes integrating the formation of thick inductors with the formation of bond pads, terminals and interconnect wiring with the last metal +1 wiring. Included are dielectric deposition and spacer formation steps, and/or selective deposition of a passivating metal such as CoWP, to passivate a Cu inductor that is formed after the last metal layer.

4 Claims, 14 Drawing Sheets

Al BOND PAD

LAST METAL Cu FORMATION

SiN/SiO2/SiN PASSIVATION DEPOSITION

TERMINAL VIA PATTERNING

PATTERN Al BOND PAD, TaN BARRIER, Cu SEED

RESIST PATTERN AND Cu PLATING FOR INDUCTOR

RESIST STRIP, Cu ETCH, TaN ETCH, CoWP SELECTIVE DEP.

POLYMIDE APPLY, FINAL VIA OPENING

ETCH SiN, DEP. BARRIER, FORM C4 SOLDER BUMPS

Cu BOND PAD

DEPOSIT TaN
BARRIER

RESIST PATTERN
AND Cu PLATING
FOR INDUCTOR

RESIST STRIP,
Cu ETCH,
TaN ETCH,
CoWP SELECTIVE DEP.

POLYIMIDE APPLY, FINAL VIA OPENING

ETCH SiN, DEP. BARRIER, FORM C4 SOLDER BUMPS

RAISED Cu BOND PAD

RESIST PATTERN AND Cu PLATING FOR INDUCTOR

RESIST STRIP, TaN ETCH, CoWP SELECTIVE DEP.

POLYIMIDE APPLY, FINAL VIA OPENING

ETCH SiN, DEP. BARRIER, FORM C4 SOLDER BUMPS

DEPOSIT TaN BARRIER AND Cu SEED

RESIST PATTERN AND SELECTIVE Cu PLATING FOR INDUCTOR

STRIP RESIST; ETCH Cu SEED AND BARRIER

DEPOSIT TaN BARRIER

RESIST PATTERN; DEPOSIT ADHESION LAYER AND Cu SEED

Cu PLATING

Cu CMP OR ELECTROPLATING

RESIST STRIP AND BARRIER ETCH

TERMINAL VIA PATTERNING

RESIST PATTERN; TaN AND Cu SEED

Cu PLATING

Cu CMP OR ELECTROPLATING, TaN, CMP OR RIE

RESIST STRIP

SELECTIVE METAL ONLY

DIELECTRIC DEPOSITION ONLY (SINGLE LAYER OR MULTILAYER)

SELECTIVE METAL AND DIELECTRIC

SPACER (METAL OR INSULATOR) AND DIELECTRIC DEPOSITION

SPACER (METAL OR INSULATOR) AND
SELECTIVE METAL AND DIELECTRIC DEPOSITION

SELECTIVE METAL AND SPACER
(METAL OR INSULATOR) AND DIELECTRIC DEPOSITION

METHOD OF MANUFACTURING HIGH PERFORMANCE COPPER INDUCTORS WITH BOND PADS

BACKGROUND OF INVENTION

The present invention relates generally to integration of high performance copper (Cu) inductors with bond pads, and more particularly pertains to integration of high performance copper inductors with global interconnects, and with either Al bond pads or Cu bond pads, where the Cu for the inductor and the global interconnects is defined by a resist pattern above the chip passivation layer. In addition, the inductor can be fabricated by superposing the adjacent wiring layers or levels to form a laminate inductor, with the metal levels being interconnected by a bar via.

Copper inductors are being used increasingly in RF integrated circuits. The performance of a Cu inductor is maximized by maximizing the thickness of the Cu. This can be achieved by plating a thick Cu layer (>5 um) inside a resist mask.

Unfortunately, it is difficult to passivate thick Cu inductors, wherein passivation serves as a diffusion barrier to protect Cu from corrosion. If the Cu inductor is formed below the last metal level (i.e. the last metal layer before the chip passivation layer), then planarization of subsequent metal levels is difficult and/or expensive. If the Cu inductor is formed at or above the last metal level, then passivation of the Cu is difficult. Typically, the last metal layer is passivated with Si3N4 and SiO2 layers, which are deposited by chemical vapor deposition (CVD), to prevent contaminants from diffusing into the transistors and wiring in the chip. However, the conformality of CVD films is not adequate to passivate thick Cu inductors. In addition, the processes used to form the inductor and the inductor passivation must not damage the bond pads.

SUMMARY OF INVENTION

The present invention provides integration of high performance copper inductors with global interconnects, and with either Al bond pads or Cu bond pads, where the Cu for the inductor and the global interconnects is defined by a resist pattern above the chip passivation layer. In addition, the inductor can be fabricated by superposing the metal layer above the passivation with underlying metal wiring layers or levels to form a laminate inductor, with the metal levels being interconnected by a bar via, and-having the same spiral shape as the spiral metal inductors at each metal level in the inductor stack.

The present invention provides a method for passivating thick Cu inductors separately from the chip passivation. In addition, the present invention provides methods for integrating thick inductors with bond pads, terminals and interconnect wiring using the metal layer above the chip passivation.

The subject invention uses dielectric deposition, spacer formation, and/or selective deposition of a passivating metal such as CoWP, to passivate a Cu inductor that is formed after the last metal layer. In addition, the process is integrated with the formation of bond pads, terminals and interconnect wires.

The advantages of the present invention include:
the ability to use high performance Cu inductors with minimal additional processing;
the formation of passivation over Cu inductors formed after the last metal layer;
the Cu used for the inductors can also be used as a last metal +1 wiring layer or for raised bond pads and for interconnect wiring;
process is compatible with raised Al bond pads or recessed Cu bond pads.

BRIEF DESCRIPTION OF DRAWINGS

The foregoing objects and advantages of the present invention for integration of high performance copper inductors with bond pads may be more readily understood by one skilled in the art with reference being had to the following detailed description of several embodiments thereof, taken in conjunction with the accompanying drawings wherein like elements are designated by identical reference numerals throughout the several views, and in which:

FIG. 1a illustrates the structure after formation of last metal layer damascene Cu interconnects in an FSG dielectric using conventional processing steps.

FIG. 1b illustrates the structure after depositing two layers of Si3N4 and an intermediate layer of SiO2 passivation.

FIG. 1c illustrates the structure after patterning of terminal vias by lithography and RIE.

FIG. 1d illustrates the structure after depositing multiple layers of metal for a bond pad by PVD or CVD, depositing a Si3N4 layer by CVD, patterning by lithography and RIE, and depositing a Cu seed layer by PVD.

FIG. 1e illustrates the structure after depositing and patterning resist for Cu inductors and depositing Cu.

FIG. 1f illustrates the structure after stripping of the resist, etching Cu seed and TaN, and selectively depositing CoWP on Cu inductors.

FIG. 1g illustrates the structure after coating the substrate with polyimide and forming openings to bond pads.

FIG. 1h illustrates the structure after etching SiN layer on bond pads, depositing a BLM barrier, and forming C4 solder balls.

FIGS. 4a–4c illustrate option 1 in which the seed layer is deposited before the resist, followed by selective deposition of Cu.

FIG. 4a illustrates, after the terminal via etch, the structure formed by depositing a TaN barrier by PVD and depositing Cu seed layer by PVD.

FIG. 4b illustrates the structure formed by depositing and patterning resist for inductors, terminals and interconnects, and depositing Cu by electroplating to selectively form Cu in inductor, terminal and interconnect regions.

FIG. 4c illustrates the structure after stripping resist and etching the Cu seed and barrier.

FIGS. 5a–5e illustrate option 2 in which the Cu seed layer is deposited after the resist, followed by blanket deposition of Cu and CMP.

FIG. 5a illustrates, after the terminal via etch, the structure formed by depositing TaN barrier by PVD.

FIG. 5b illustrates the structure formed after depositing and patterning resist for inductors, terminals, interconnects, and depositing Cu seed layer by PVD.

FIG. 5c illustrates the structure after depositing Cu by electroplating.

FIG. 5d illustrates the structure after removing excess Cu by CMP or electropolishing.

FIG. 5e illustrates the structure after stripping the resist and etching.

FIGS. 6a–6e illustrate option 3 for patterning Cu in which the barrier and seed layers are deposited after the resist and a blanket deposition of Ta and Cu, followed by CMP or etching.

FIG. 6a illustrates the structure formed after terminal via patterning.

FIG. 6b illustrates the structure formed after depositing and patterning resist for inductors, terminals and interconnects, depositing Ta adhesion layer, depositing Cu seed layer by PVD.

FIG. 6c illustrates the structure after depositing Cu by electroplating to selectively form Cu in unmasked regions.

FIG. 6d illustrates the structure after removing excess Cu by CMP or electropolishing, and removing TaN adhesion layer by CMP or wet etch.

FIG. 6e illustrates the structure after stripping the resist and etching TaN.

FIG. 7a illustrates passivation by selective metal only.

FIG. 7b illustrates passivation by dielectric deposition only.

FIG. 7c illustrates passivation by selective metal and dielectric deposition, which is a combination of FIGS. 7a and 7b.

FIG. 7d illustrates passivation by spacer (metal or insulator), and dielectric deposition.

DETAILED DESCRIPTION

Figure 1:
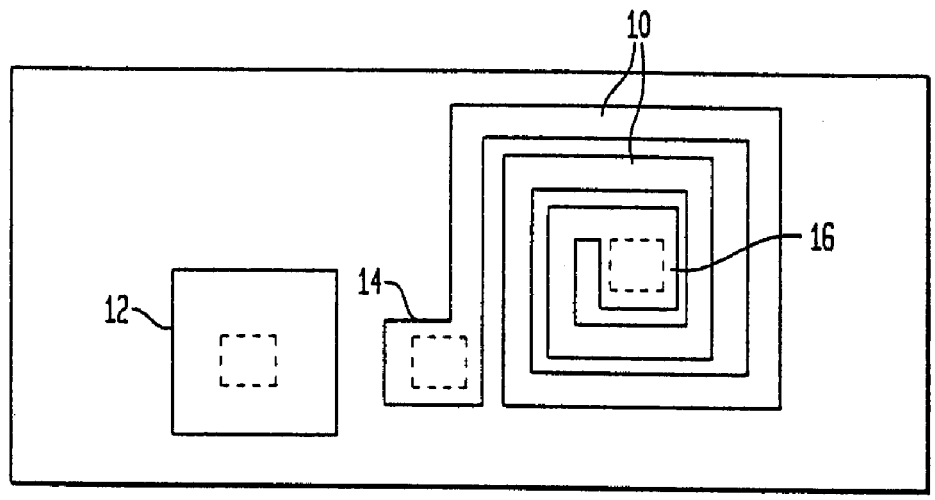
FIG. 1 illustrates a top plan view of a first embodiment of the present invention for a spiral Cu inductor having a raised Al bond pad.

FIG. 1 illustrates a top plan view of a first embodiment of the present invention for a spiral Cu inductor 10 having an Al (aluminum) bond pad 12, a Cu wire terminal 14 coupled to the outer end of the spiral Cu inductor, and a Cu wire terminal 16 coupled to the inner end of the spiral Cu inductor.

The embodiment of FIG. 1 provides integration of high performance copper inductors with bond pads wherein a tall, last metal layer Cu inductor is integrated with an Al bond pad. Moreover, the tall Cu inductor can be fabricated by superposing and connecting adjacent wiring layers at the last metal and the last metal +1, with the metal levels being interconnected by a bar via having the same shape as the metal inductor.

FIGS. 1a–1h illustrate the sequential steps a–h for fabrication of the first embodiment of the present invention for a spiral Cu inductor having an Al bond pad as shown in FIG. 1.

Figure 1A:
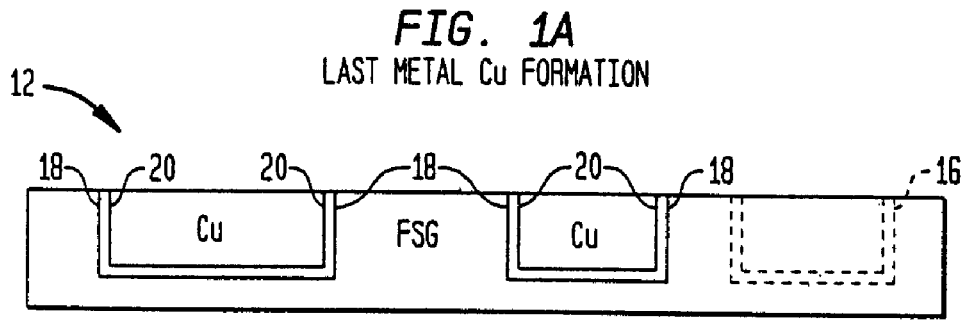
FIGS. 1a–1h illustrate the sequential steps a–h for fabrication of the first embodiment of the present invention for a spiral Cu inductor having a raised Al bond pad.

FIG. 1a illustrates the structure after formation of last metal layer damascene Cu interconnects in an FSG (fluoro silicate glass) dielectric using conventional processing steps of dielectric FSG deposition, trench 18 patterning, liner 20 deposition which could be TaN or TiN, Cu deposition, and CMP (chemical mechanical polishing). The last metal layer is traditionally known as the last metal layer beneath the bond pad layer, and that terminology is maintained herein.

Figure 1B:
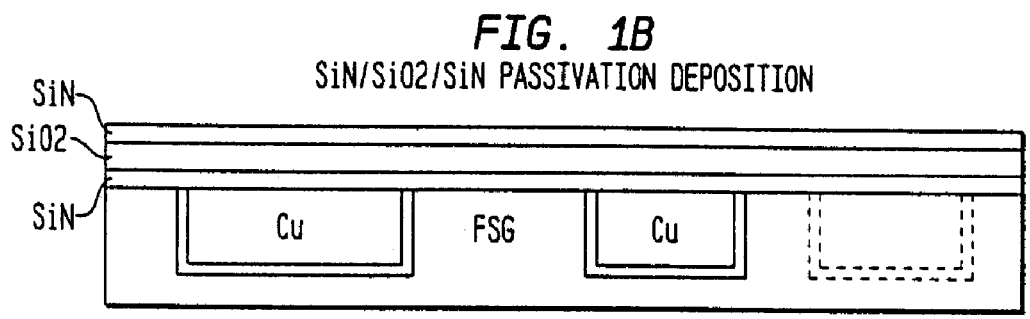

FIG. 1b illustrates the structure after depositing two layers of Si3N4 (shown in the Figures herein as SiN) and an intermediate layer of SiO2 passivation by CVD (chemical vapor deposition), 10 to 500 nm, 200 nm preferred for each of the three layers.

Figure 1C:
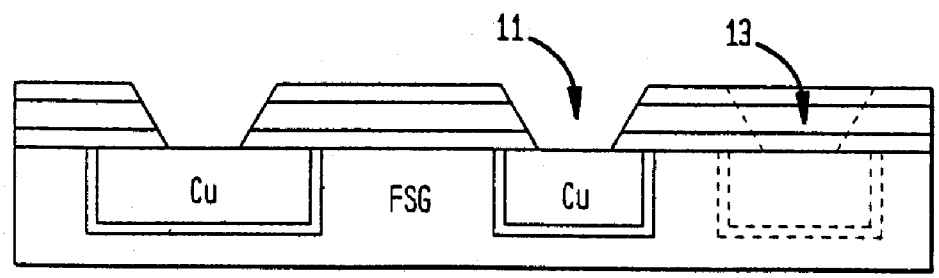

FIG. 1c illustrates the structure after patterning of terminal vias by lithography and RIE (reactive ion etch with a F based etch). In the present invention, a tall Cu spiral inductor is fabricated using a thick Cu layer above the chip passivation, or by interconnecting this layer and underlying wiring layers with intermediate metal bar vias having the same spiral shape as the spiral metal inductor, which is shown as the middle via 11 and the right via 13 shown in phantom which are part of one spiral bar via forming a part of the spiral inductor 10.

Figure 1D:
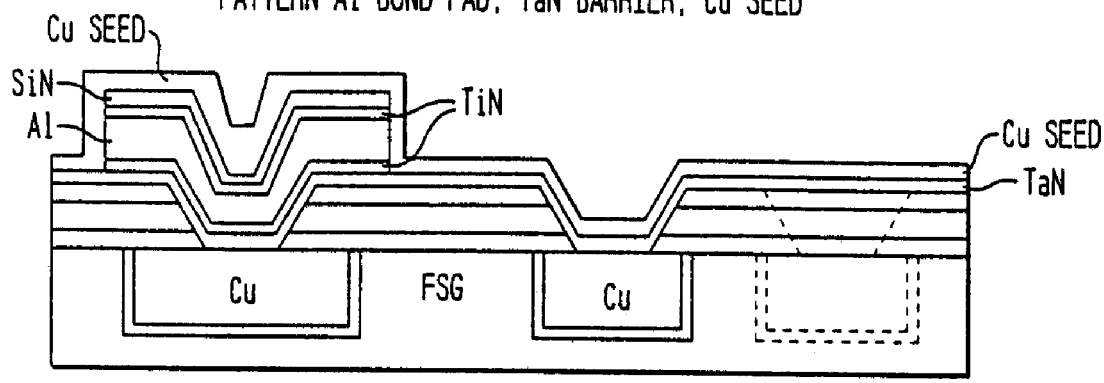

FIG. 1d illustrates the structure after depositing multiple layers of metal for a bond pad; four successive layers from bottom to top of TaN/TiN/Al/TiN by PVD (physical vapor deposition) or CVD, 10 to 50 nm, 50 nm preferred for TaN and TiN, 500 to 2000 nm, 1000 nm preferred for Al; depositing a Si3N4 layer by CVD, 20 to 100 nm, 50 nm preferred; patterning SiN, TiN, Al by lithography and RIE (F- and Cl- based etch); depositing Cu seed layer 30, 20 to 500 nm, 200 nm preferred by PVD.

Figure 1E:
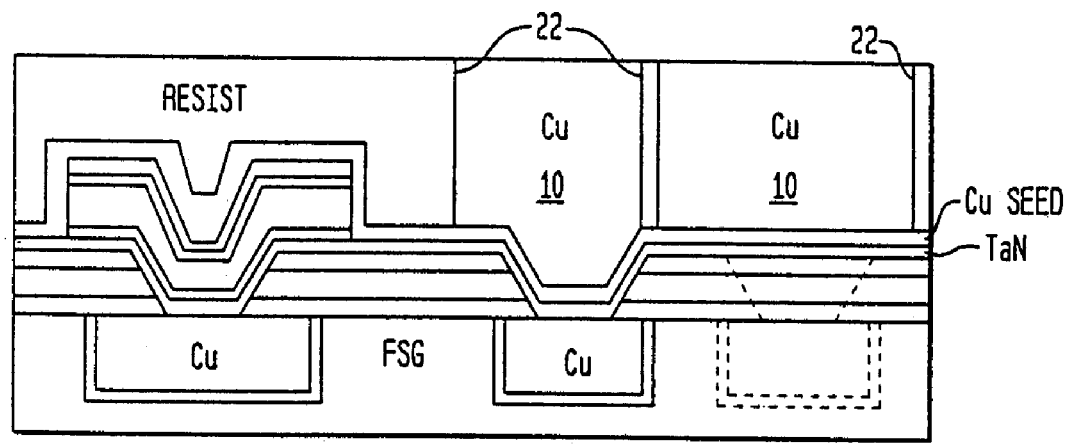

FIG. 1e illustrates the structure after depositing and patterning resist 22 for Cu inductors 10, resist thickness =1 to 50 um; depositing Cu by electroplating to selectively form Cu in inductor regions, 1 to 50 um, 10 um preferred.

Figure 1F:
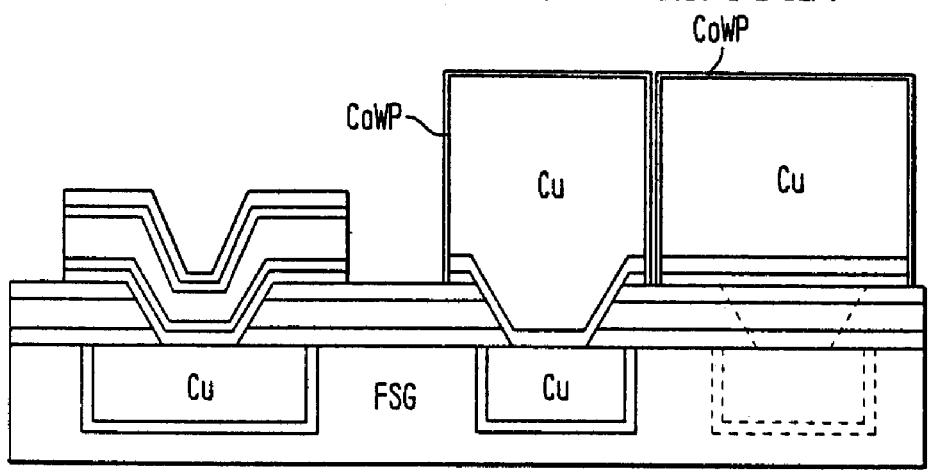

FIG. 1f illustrates the structure after stripping of the resist using organic solvent or low temperature (<100 C, 80 C preferred), low power O2 plasma; etching Cu seed (option 1 or 2 or 3 as explained below) by sputter etch; etching TaN by RIE (F-based); selectively depositing CoWP (preferred 92% Co, 2% W, 6% P) on Cu inductors using electroless deposition, 10 to 50 nm, 20 nm preferred; optionally depositing additional SiN passivation by CVD (optional-see FIGS. 7a–7f).

Figure 1G:
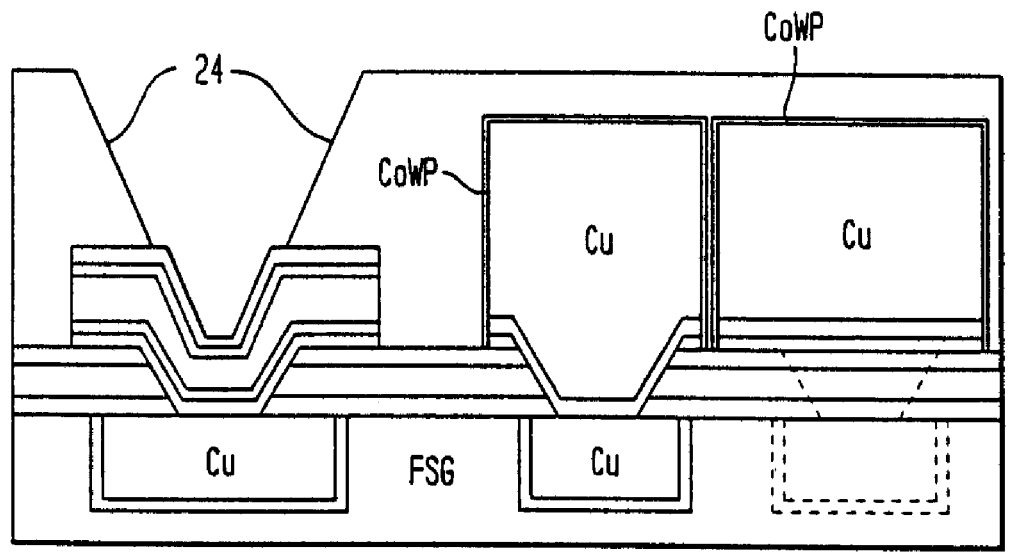

FIG. 1g illustrates the structure after coating the substrate with polyimide 24 (1 to 50 um, 5 um preferred); forming openings to bond pads.

Figure 1H:
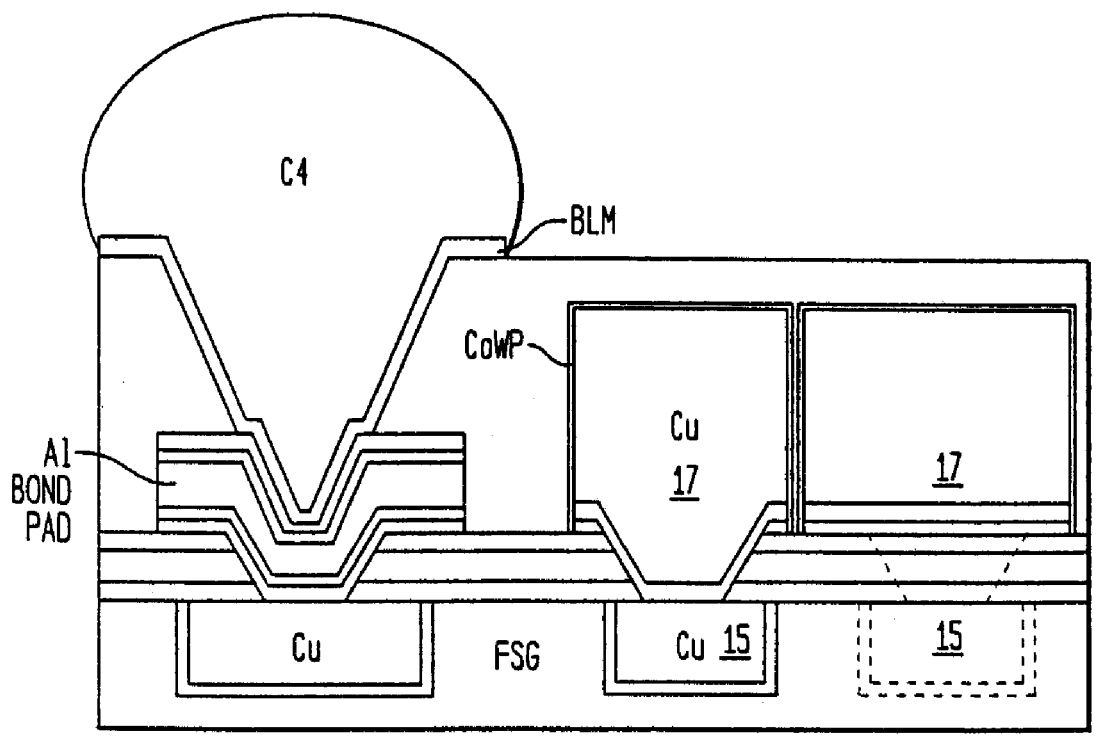

FIG. 1h illustrates the structure after etching SiN layer on bond pads; depositing BLM (barrier layer metallurgy), such as TiW 50–500 nm, 100 nm preferred, and forming C4 solder balls. The completed tall Cu spiral inductor 10 comprises the Cu layer above the passivation 17, with a Cu via 19 forming a connection to underlying Cu wires in the last Cu metal level 15. In a different embodiment, the tall Cu spiral inductor 10 comprises the Cu layer above the passivation 17 interconnected and superposed with underlying spiral Cu wiring layers such as last Cu metal level 15, connected with an intermediate spiral Cu bar via 19 which are all interconnected and superposed to form the tall laminate spiral Cu inductor 10 which also has an Al bond pad.

Figure 2:
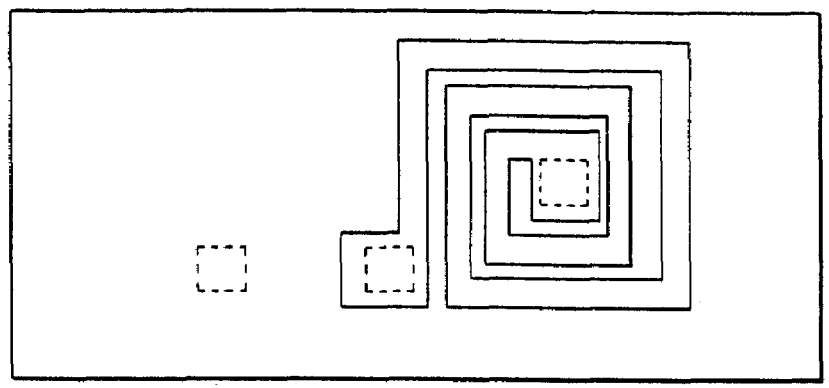
FIG. 2 illustrates a top plan view of a second embodiment of the present invention for a spiral Cu inductor which is similar to the spiral Cu inductor of FIG. 1 but having a recessed Cu bond pad.

FIG. 2 illustrates a top plan view of a second embodiment of the present invention for a spiral Cu inductor which is similar to the spiral Cu inductor of FIG. 1 but having a Cu (copper) bond pad.

The sequential steps a–c and e–h for fabrication of the second embodiment of the present invention are substantially the same as steps a–c and e–h for fabrication of the first embodiment. Moreover, steps a–c of the second embodiment are illustrated fully in FIGS. 1a–1c, and accordingly the description of steps a–c is not repeated, and the description of steps d–h is given with respect to FIGS. 2d–2h.

Additionally, the parameters specified above for thickness and preferred thickness of the different particular layers and particular materials, exemplary compositions of alloys, examples of materials, and other specified parameters such as temperature, are equally applicable to the embodiments described below and accordingly will not be repeated in the following descriptions.

Steps a–c in the fabrication of the second embodiment are illustrated and explained with reference to FIGS. 1a–1c, and accordingly the explanation of the second embodiment starts with step d illustrated in FIG. 2d.

Figure 2D:
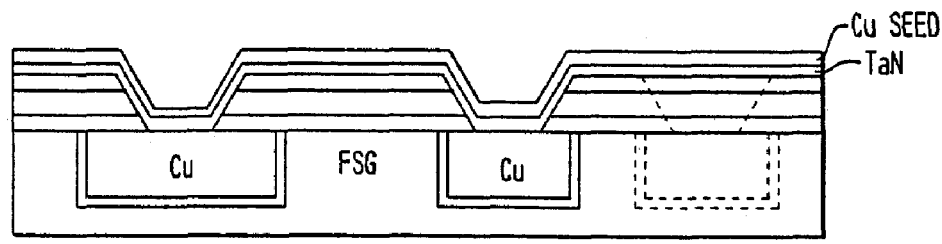
FIG. 2d illustrates the structure after depositing TaN barrier by PVD, and depositing Cu seed layer by PVD.

FIG. 2d illustrates the structure after depositing TaN barrier by PVD; depositing Cu seed layer by PVD.

Figure 2E:
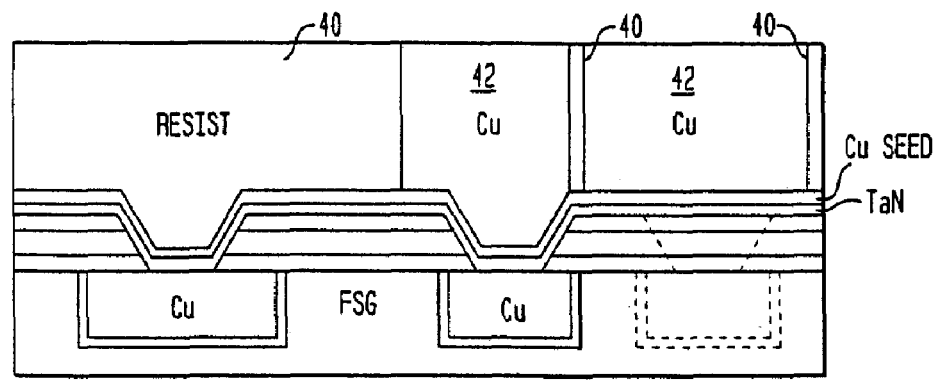
FIG. 2e illustrates the structure after depositing and patterning resist for Cu inductors and depositing Cu by electroplating to selectively form Cu in inductor regions.

FIG. 2e illustrates the structure after depositing and patterning resist 40 for Cu inductors 42; depositing Cu by electroplating to selectively form Cu in inductor regions 42.

Figure 2F:
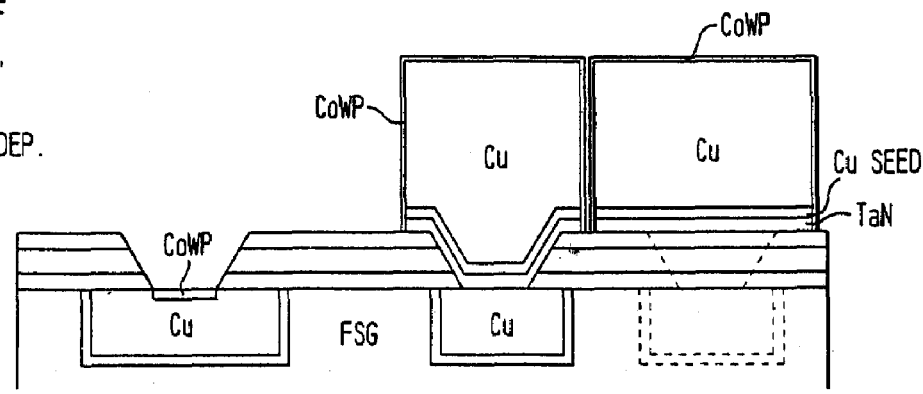
FIG. 2f illustrates the structure after stripping of the resist, etching the Cu seed and TaN barrier and selectively depositing CoWP on Cu inductors and terminals using electroless deposition.

FIG. 2f illustrates the structure after stripping of the resist using organic solvent or low temperature, low power O2 plasma; etching Cu seed (option 1 or 2 or 3 as explained below with reference to FIGS. 4–6) by sputter etch; etching TaN by RIE (F-based); selectively depositing CoWP on Cu inductors and terminals using electroless deposition; optionally depositing additional SiN passivation by CVD (see FIGS. 7a–7f).

The following options 1 and 2 can be employed instead of the CoWP capping layer. Options 1 and 2 are applicable to all of the embodiments herein with a CoWP capping layer.

Option 1. Other materials can be deposited by selective electroless plating instead of using CoWP, namely NiMoP, NiMoB, NiReP, NiWP.

Option 2. Use selective chemical vapor deposition (CVD) instead of selective electroless plating to deposit a passivating layer on the Cu, The preferred material is W. Other options are Mo or Ru. So for example, selective CVD W would be used instead of CoWP. The process sequence would be the same.

Figure 2G:
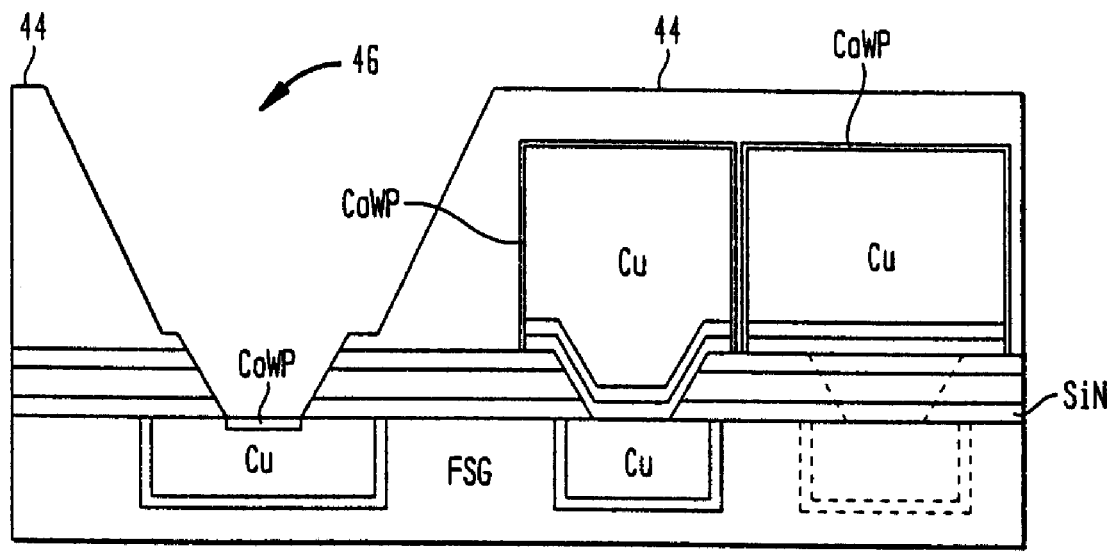
FIG. 2g illustrates the structure after coating the substrate with polyimide and forming via openings to bond pads.

FIG. 2g illustrates the structure after coating the substrate with polyimide 44, forming via openings 46 to bond pads.

Figure 2H:
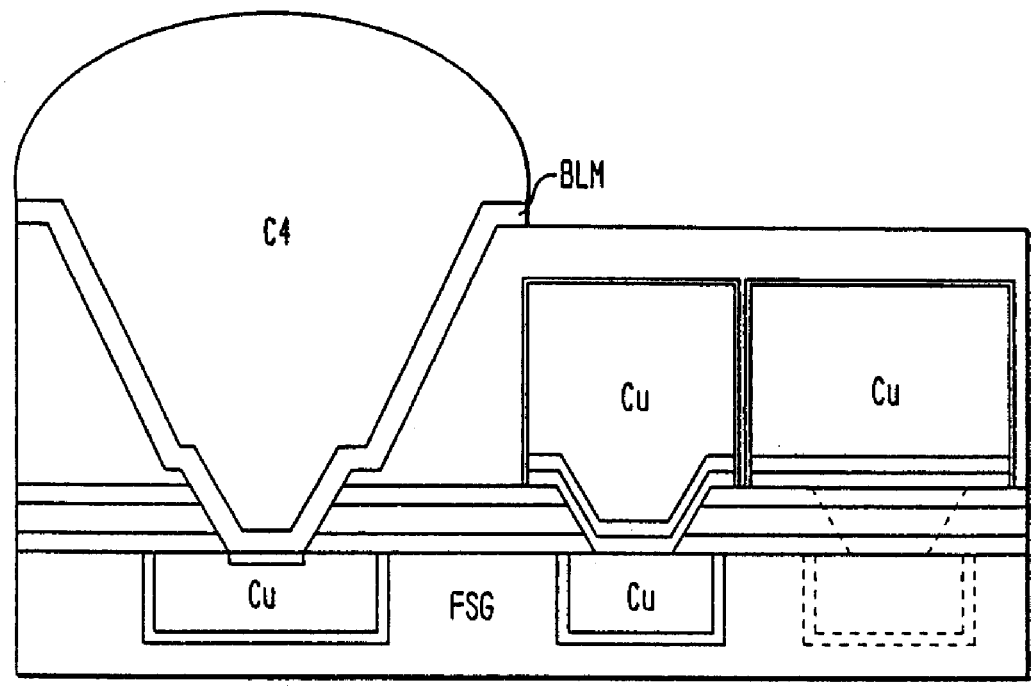
FIG. 2h illustrates the structure after depositing barrier layer metallurgy BLM and forming C4 solder balls.

FIG. 2h illustrates the structure after depositing barrier layer metallurgy BLM (barrier layer metallurgy), and forming C4 solder balls.

Figure 3:
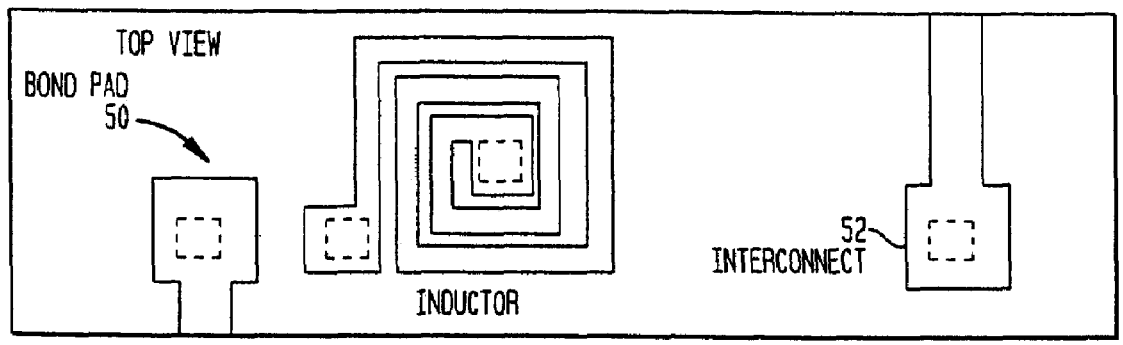
FIG. 3 illustrates a top plan view of a third embodiment of the present invention for a spiral Cu inductor having a raised Cu bond pad.
Figure 3E:
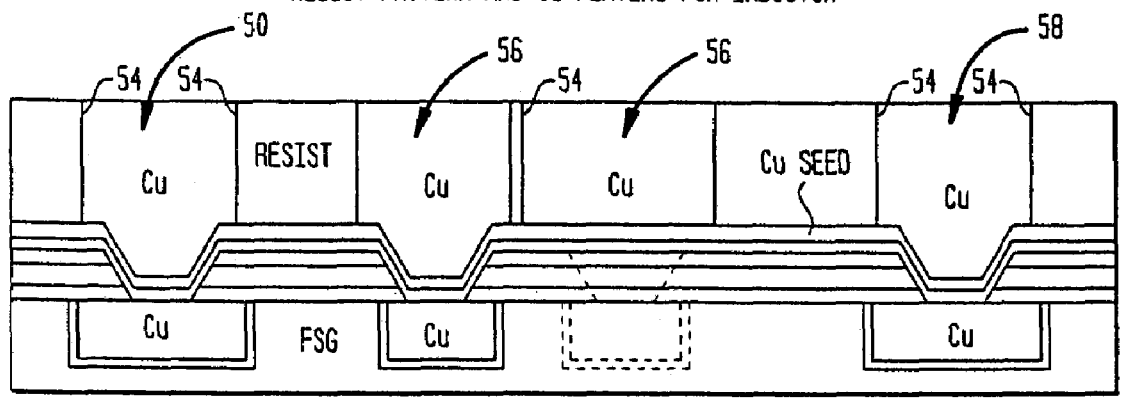
FIG. 3e illustrates the structure after depositing and patterning resist for raised bond pads, Cu inductors and interconnect wiring, and depositing Cu by electroplating.
Figure 3F:
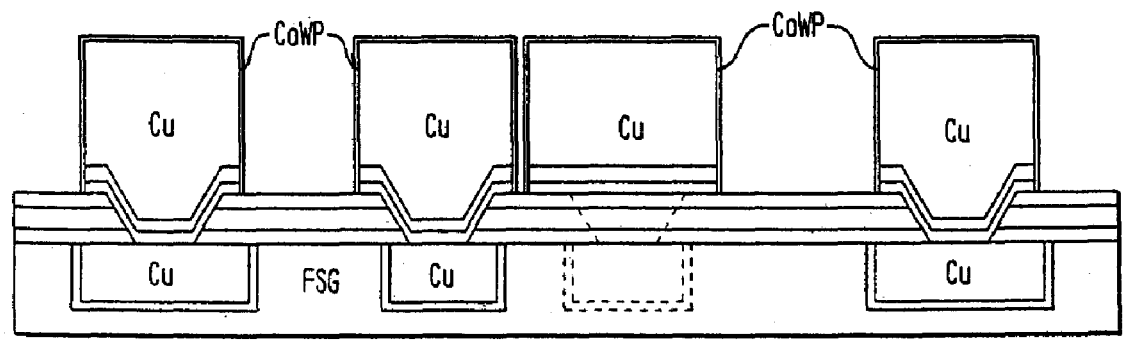
FIG. 3f illustrates the structure after stripping of the resist, etching the TaN barrier, and selectively depositing CoWP on Cu inductors, terminals and interconnect wiring using electroless deposition.
Figure 3G:
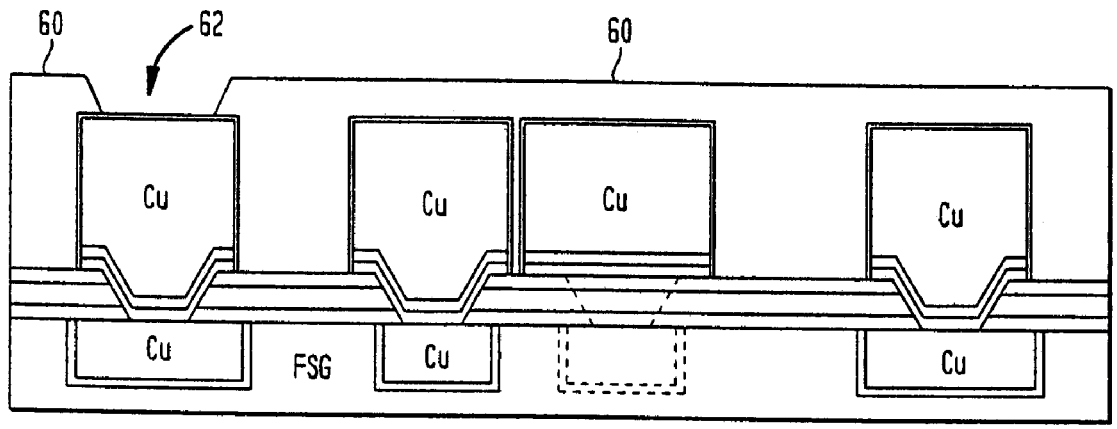
FIG. 3g illustrates the structure after coating the substrate with polyimide and forming via openings to bond pads.
Figure 3H:
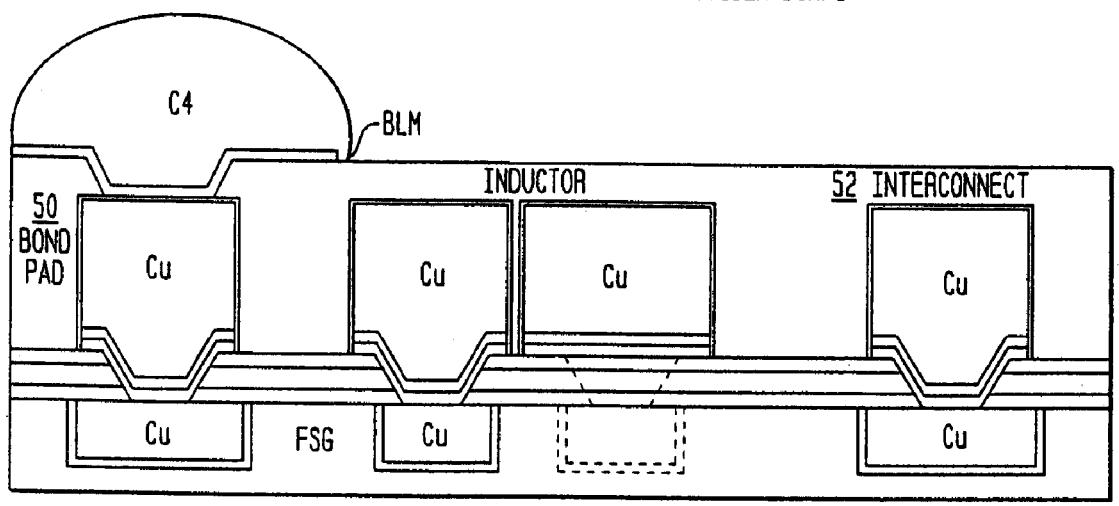
FIG. 3h illustrates the structure after etching SiN, depositing barrier layer metallurgy BLM and forming C4 solder balls.

FIG. 3 illustrates a top plan view of a third embodiment of the present invention for a spiral Cu inductor having a raised Cu (copper) bond pad 50, FIG. 3h.

The third embodiment also illustrates interconnect wiring 52 which can encompass global interconnects for cross chip wiring. The interconnect wiring could also have been illustrated in the first and second embodiments and is equally applicable to the first and second embodiments.

The sequential steps a–d and f–h for fabrication of the third embodiment of the present invention are substantially the same as steps a–d and f–h for fabrication of the second embodiment. Moreover, steps a–d of the second embodiment are illustrated fully in FIGS. 1a–1c and 2d, and accordingly the description of steps a–d is not repeated and the description of steps e–h is given with respect to FIGS. 3e–3h.

FIG. 3e illustrates the structure after depositing and patterning resist 54 for raised bond pads at 50, Cu inductors at 56, and interconnect wiring at 58; depositing Cu by electroplating, selectively patterning Cu in the unmasked regions (option 1 or 2 or 3 as explained below).

FIG. 3f illustrates the structure after stripping of the resist using organic solvent or low temperature O2 plasma; etching Cu seed (option 1 or 2 or 3 as explained below) by sputter etch; etching TaN by RIE (F-based); selectively depositing CoWP on Cu inductors, terminals and interconnect wiring using electroless deposition; optionally depositing additional SiN passivation by CVD (see FIGS. 7a–7f).

FIG. 3g illustrates the structure after coating the substrate with polyimide 60; forming via openings 62 to bond pads.

FIG. 3h illustrates the structure after etching SiN, depositing BLM (barrier layer metallurgy), and forming C4 solder balls.

FIGS. 4, 5 and 6 illustrate respective first (1), second (2) and third (3) options for patterning Cu.

Figure 4A:
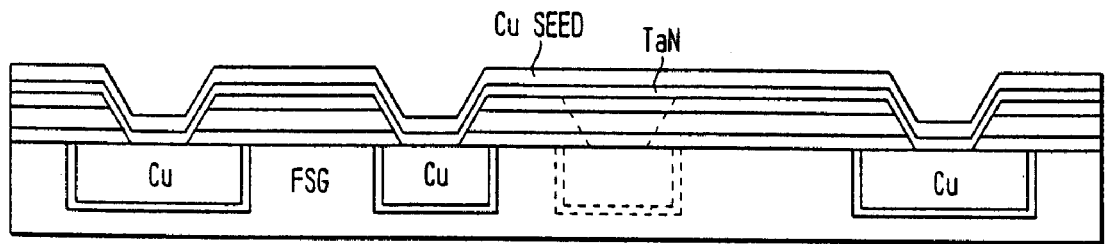
FIGS. 4a–4c, 5a–5e and 6a–6e illustrate respective first (1), second (2) and third (3) options for patterning Cu.
Figure 4B:
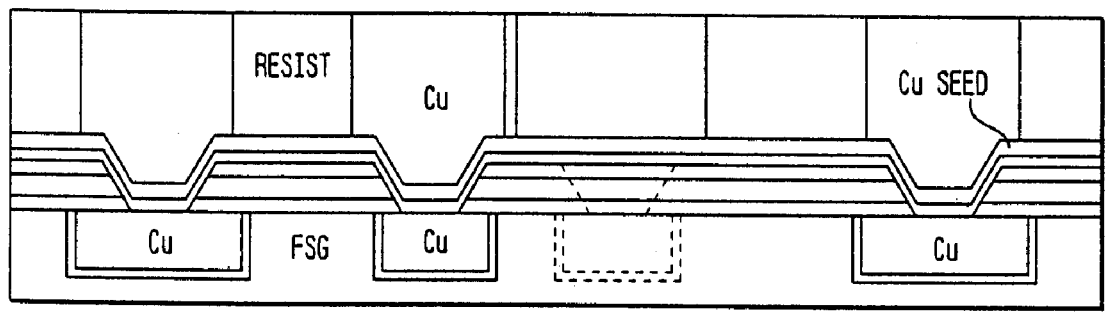
Figure 4C:
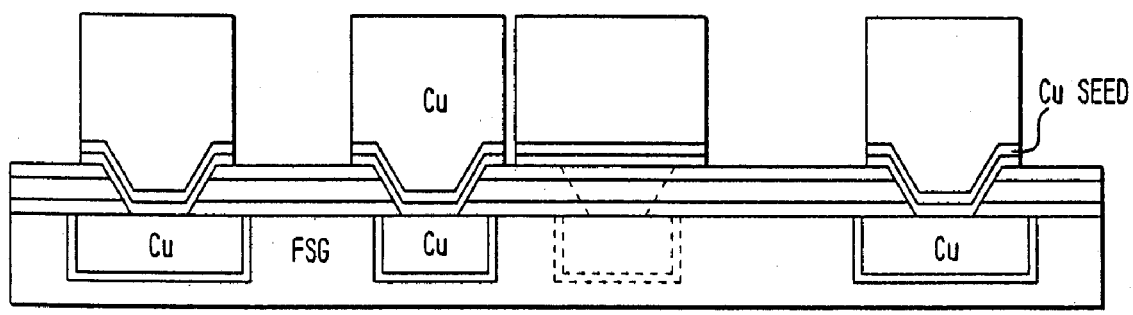

FIGS. 4a–4c illustrate option 1 in which the seed layer is deposited before the resist, followed by selective deposition of Cu.

FIG. 4a illustrates, after the terminal via etch, the structure formed by depositing a TaN (or Ta barrier) by PVD, 10 to 100 nm(different from FIG. 1d?), 50 nm preferred; depositing Cu seed layer by PVD.

FIG. 4b illustrates the structure formed by depositing and patterning resist 70 for inductors, terminals and interconnects; depositing Cu by electroplating, selectively forming Cu in inductor, terminal and interconnect regions.

FIG. 4c illustrates the structure after stripping resist using organic solvent or low temperature, low power O2 plasma; etching Cu seed by sputter etch; etching TaN by RIE (F-based).

FIGS. 5a–5e illustrate option 2 in which the Cu seed layer is deposited after the resist, followed by blanket deposition of Cu and CMP.

Figure 5A:
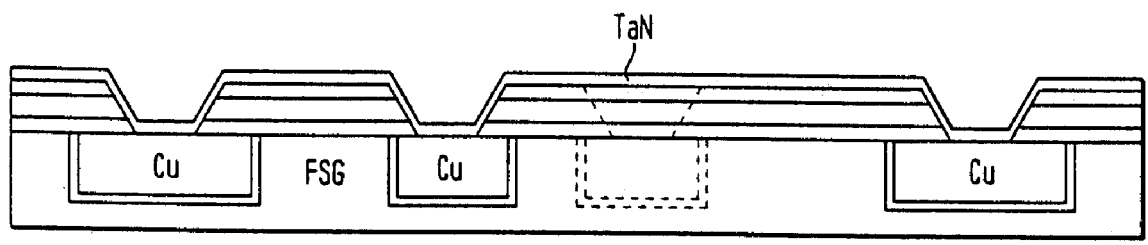

FIG. 5a illustrates, after the terminal via etch, the structure formed by depositing TaN (or Ta) barrier by PVD, 10 to 100 nm, 50 nm preferred.

Figure 5B:
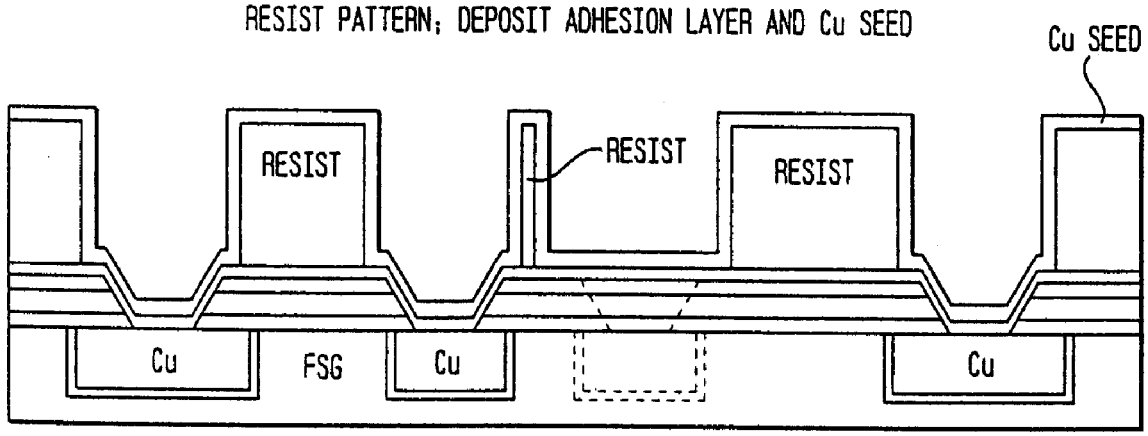

FIG. 5b illustrates the structure formed after patterning resist for inductors, terminals and interconnects; optionally depositing Ta adhesion layer, 5 to 50 nm, 20 um preferred; depositing Cu seed layer by PVD.

Figure 5C:
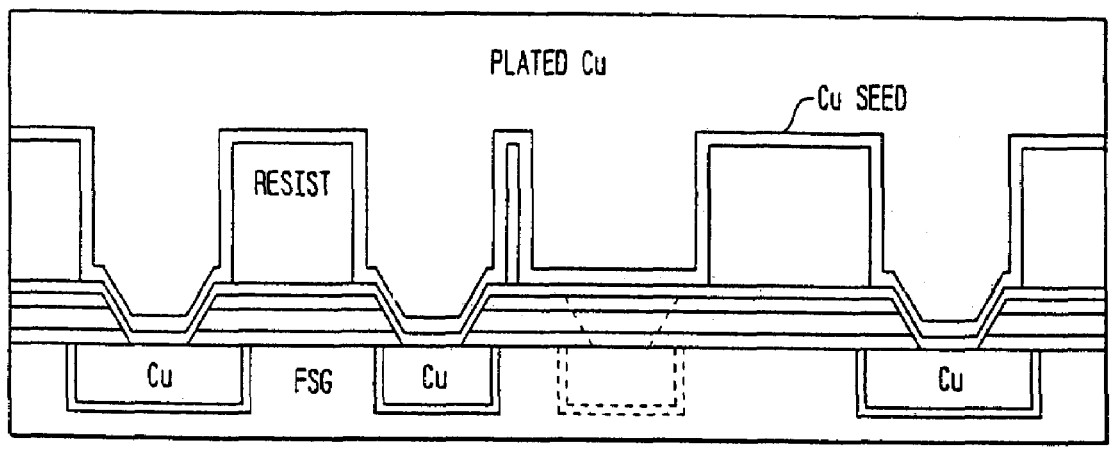

FIG. 5c illustrates the structure after depositing Cu by electroplating.

Figure 5D:
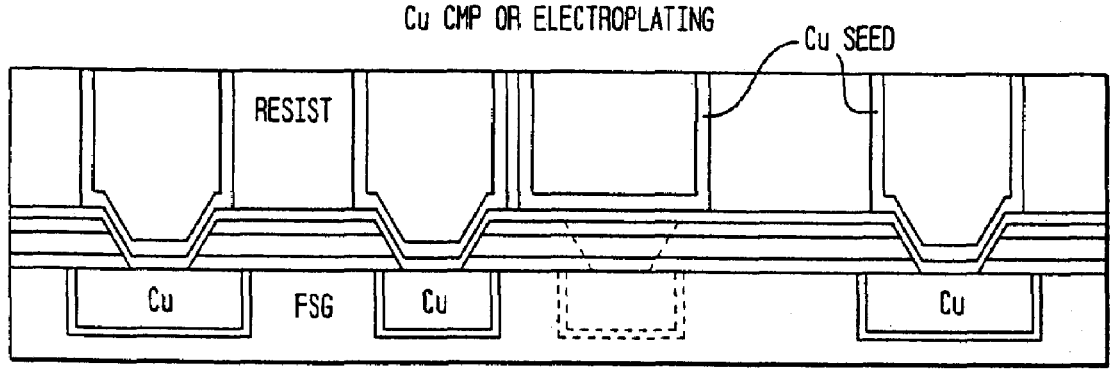

FIG. 5d illustrates the structure after removing excess Cu by CMP or electropolishing, if Ta adhesion layer was deposited, removing Ta adhesion layer by CMP (low pressure, abrasiveless CMP may be necessary to avoid damaging resist) or wet etch or dry etch.

Figure 5E:
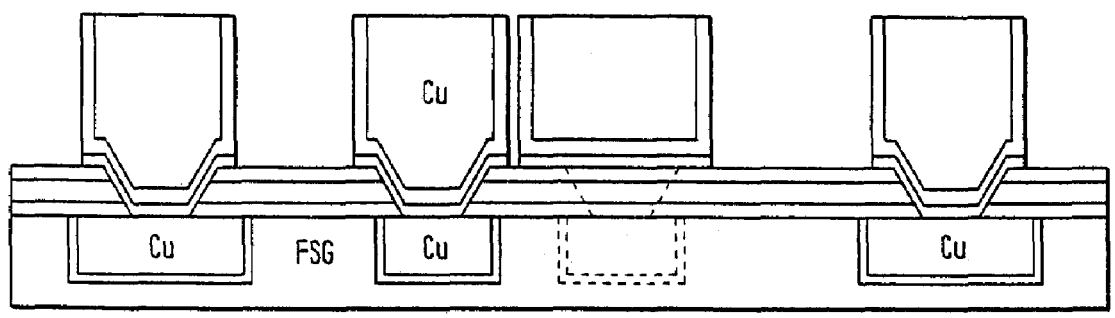

FIG. 5e illustrates the structure after stripping the resist using organic solvent or low temperature, low power O2 plasma; etching TaN by RIE (F-based).

FIGS. 6a–6e illustrate option 3 in which the barrier and seed layers are deposited after the resist and a blanket deposition of Ta and Cu, followed by CMP or etching.

Figure 6A:
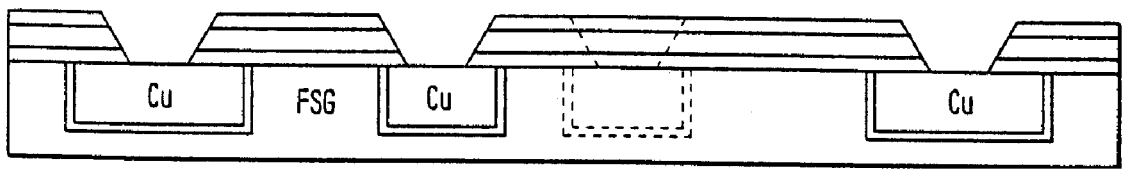

FIG. 6a illustrates the structure formed after terminal via patterning.

Figure 6B:
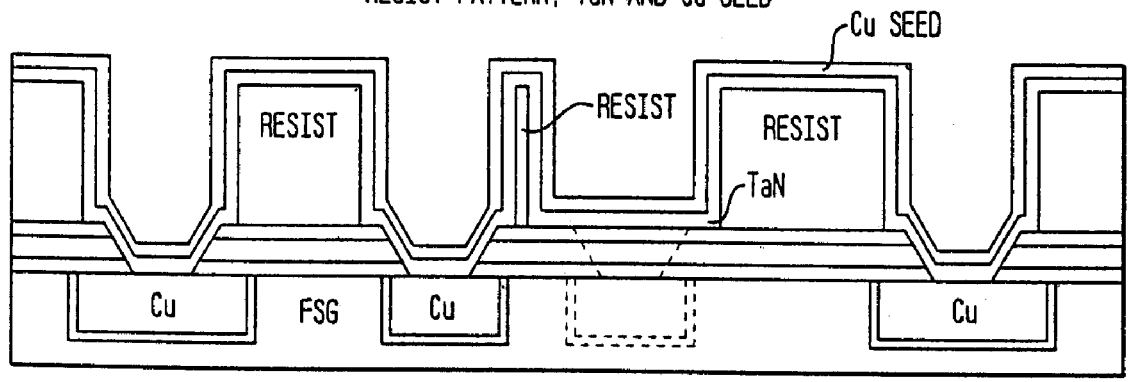

FIG. 6b illustrates the structure formed after depositing and patterning resist for inductors, terminals and interconnects, resist thickness, 1 to 20 um; depositing a TaN adhesion layer, 5 to 50 nm, 20 um preferred; depositing Cu seed layer, 20 to 500 nm, 200 um preferred, by PVD.

Figure 6C:
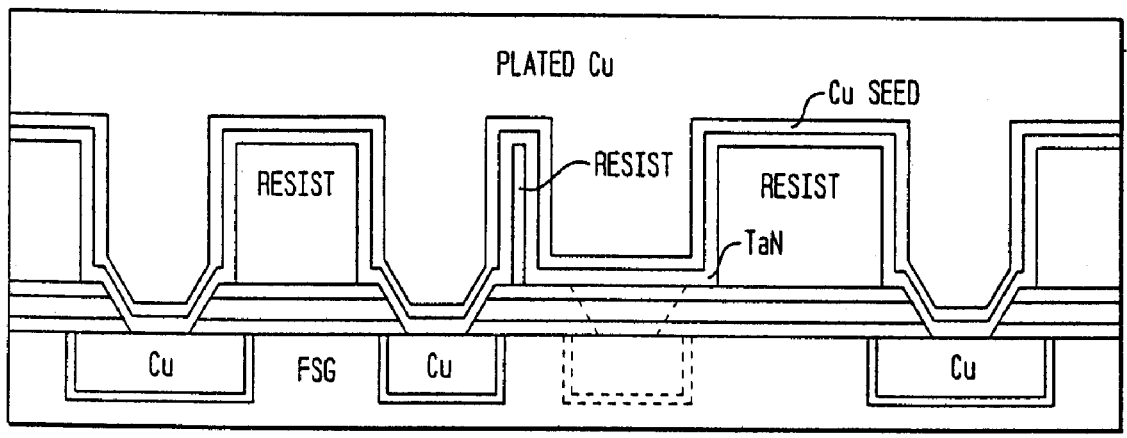

FIG. 6c illustrates the structure after depositing Cu by electroplating, selectively forming Cu in unmasked regions.

Figure 6D:
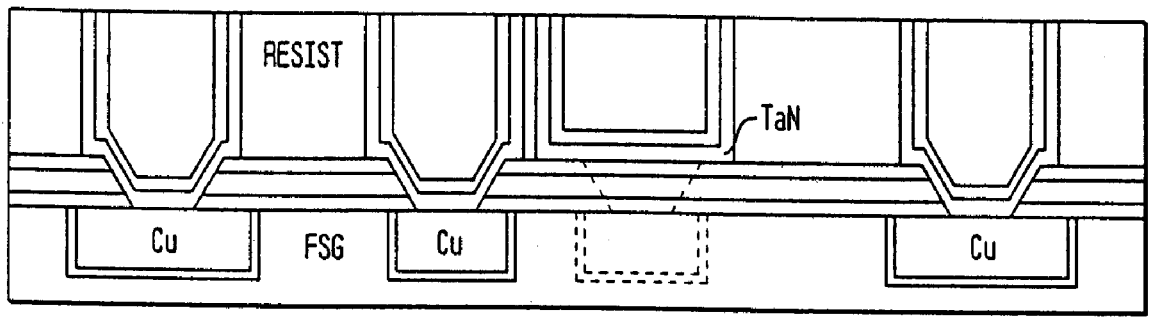

FIG. 6d illustrates the structure after removing excess Cu by CMP or electropolishing, removing TaN adhesion layer by CMP or wet etch (low pressure, abrasiveless CMP may be necessary to avoid damaging resist).

Figure 6E:
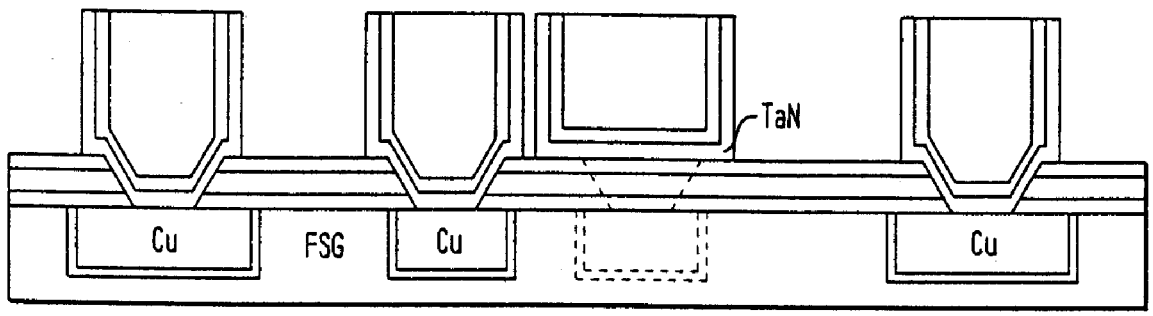

FIG. 6e illustrates the structure after stripping the resist using organic solvent or low temperature, low power O2 plasma; etching TaN by RIE (F-based).

FIGS. 7a–7d illustrate options for passivation.

Figure 7A:
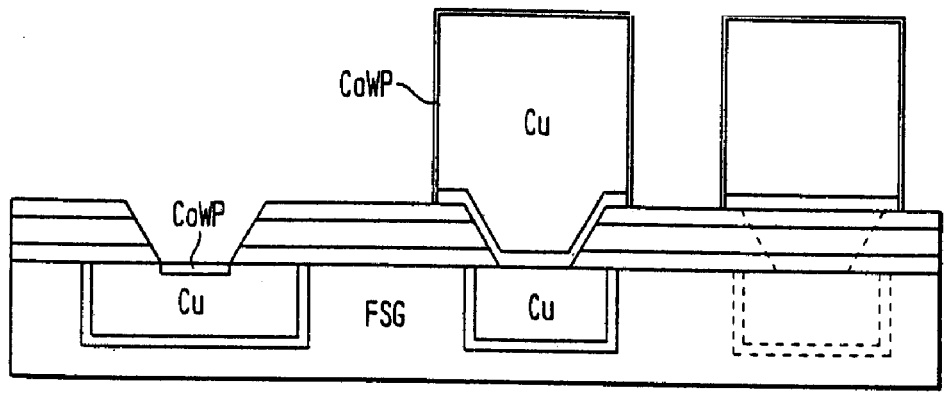
FIGS. 7a–7d illustrate options for passivation.

FIG. 7a illustrates passivation by selective metal only; after Cu patterning and barrier etch, depositing selective passivating metal such as CoWP (10 to 100 nm) by electroless deposition.

Figure 7B:
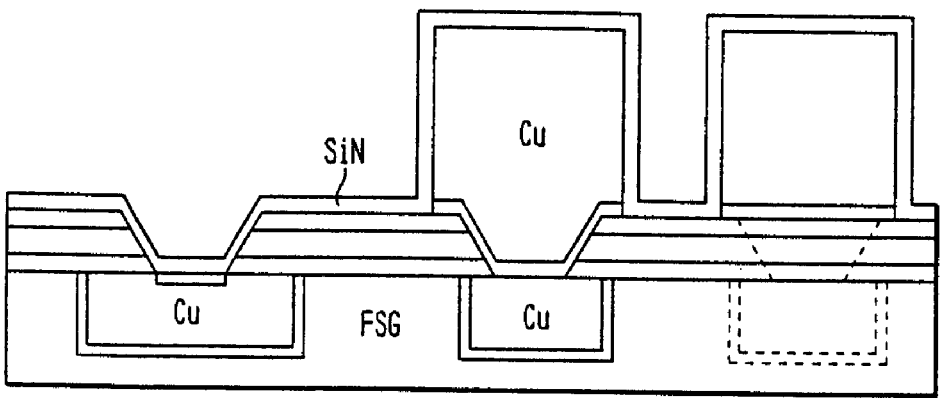

FIG. 7b illustrates passivation by dielectric depositon only; after Cu patterning and barrier etch, depositing single dielectric (100 to 500 nm Si3N4) or multilayer dielectrics (Si3N4/SiO2/Si3N4) by CVD.

Figure 7C:
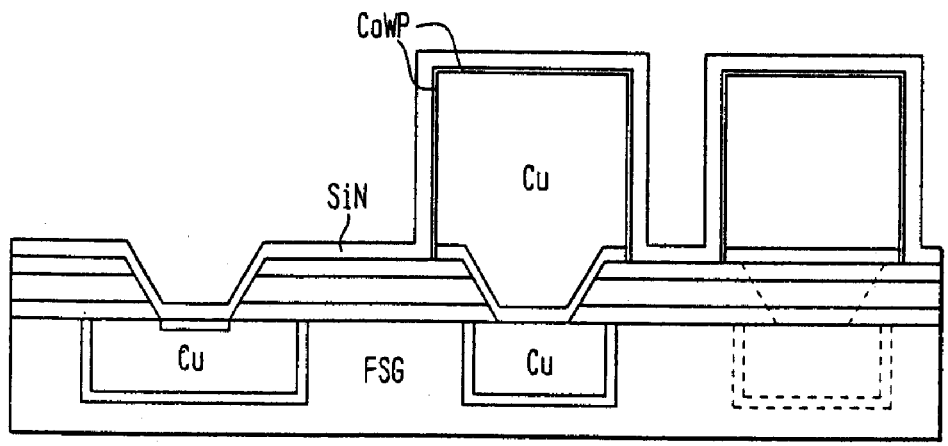

FIG. 7c illustrates passivation by selective metal and dielectric deposition, which is a combination of FIGS. 7a and 7b.

Figure 7D:
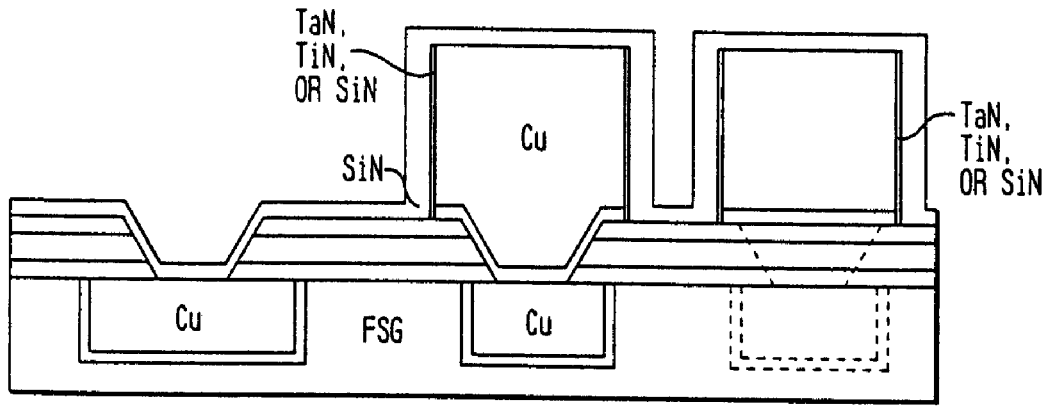

FIG. 7d illustrates passivation by spacer and dielectric deposition; after Cu patterning but prior to barrier etch, deposit passivating metal or dielectric by CVD (10 to 200 nm); etchback by RIE to form spacers, also etching the barrier layer (note spacers could also be formed after barrier layer etch); deposit single layer or multilayer dielectric.

Figure 7E:
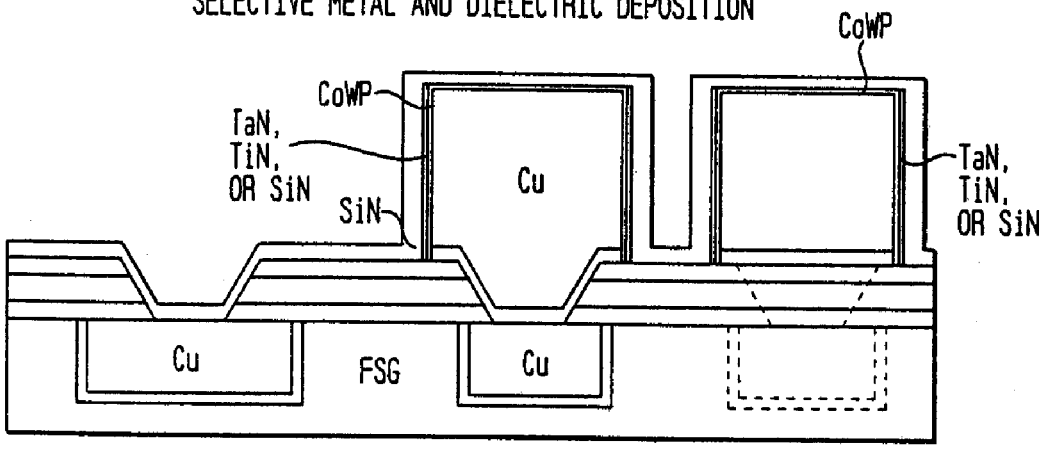
FIG. 7e illustrates passivation by spacer (metal or insulator), and selective metal, and dielectric deposition.

FIG. 7e illustrates passivation by spacer and selective metal and dielectric deposition, which is similar to FIG. 7d, but selective metal is deposited on top of Cu after spacer etches.

Figure 7F:
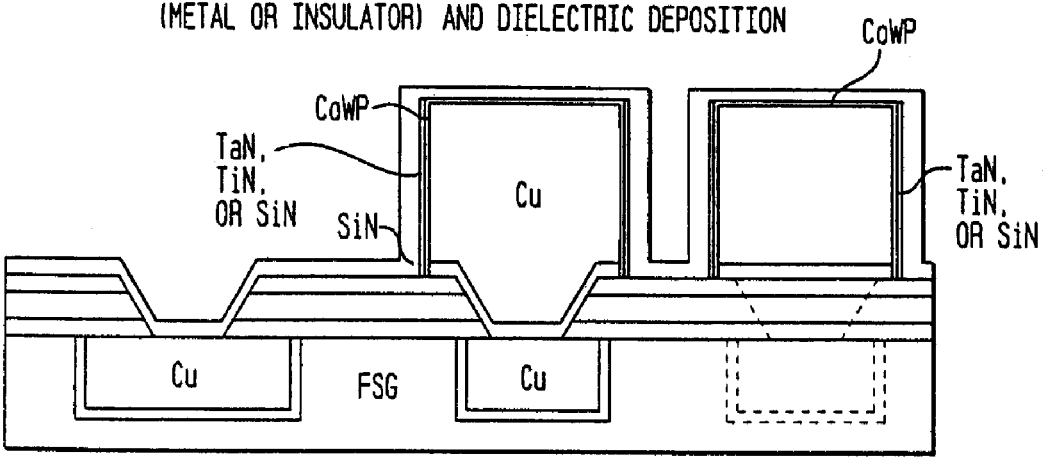
FIG. 7f illustrates passivation by selective metal, and spacer (metal or insulator), and dielectric deposition.

FIG. 7f illustrates passivation by selective metal and spacer and dielectric deposition, which is similar to FIG. 7d, but selective metal is deposited on Cu before spacers etch.

While several embodiments and variations of the present invention for integration of high performance copper inductors with bond pads are described in detail herein, it should be apparent that the disclosure and teachings of the present invention will suggest many alternative designs to those skilled in the art.

The invention claimed is:

1. A method of fabricating a high performance copper (Cu) laminate inductor comprising the steps of:

forming a last metal layer including damascene Cu interconnects in a dielectric, one Cu interconnect including a Cu laminate inductor at a last metal Cu level;

depositing one or more layers of passivation material over the last metal layer damascene Cu interconnects;

patterning terminal vias in the one or more layers of passivation material corresponding to said Cu interconnects, one terminal via including a via of the Cu laminate inductor over the last metal Cu level of the Cu laminate inductor;

forming a bond pad structure above one of said Cu interconnects including depositing metal for said bond pad and a baffler layer, patterning the metal for said bond pad and baffler layer, and depositing a Cu seed layer atop said bond pad and barrier layer;

depositing and patterning a resist for Cu inductors, and depositing Cu to selectively form Cu in inductor regions at a last metal+1 Cu level of the Cu laminate inductor over the via and the last metal Cu level, to form the Cu laminate inductor; and stripping the resist, etching the Cu seed layer, and selectively depositing a passivating layer on said Cu inductors.

2. The method of claim 1, further comprising forming a passivating layer over the last metal+1 Cu level of the Cu laminate inductor.

3. The method of claim 2, further comprising forming a passivating layer of CoWP over the last metal+1 Cu level of the Cu laminate inductor.

4. The method of claim 1, further including:

said last metal+1 level having said Cu inductors and bond pad structure with polyimide, and forming openings to said bond pad; and, depositing barrier layer metallurgy, and forming solder balls.

* * * * *